(12) United States Patent
Lim et al.

(10) Patent No.: US 11,980,051 B2
(45) Date of Patent: *May 7, 2024

(54) DISPLAY DEVICE

(71) Applicant: LG Display Co., Ltd., Seoul (KR)

(72) Inventors: SangHyun Lim, Paju-si (KR); MinJi Kang, Paju-si (KR); SeHwan Na, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/138,530

(22) Filed: Apr. 24, 2023

(65) Prior Publication Data

US 2023/0269963 A1    Aug. 24, 2023

Related U.S. Application Data

(63) Continuation of application No. 17/710,426, filed on Mar. 31, 2022, now Pat. No. 11,672,142, which is a (Continued)

(30) Foreign Application Priority Data

Dec. 27, 2018  (KR) ........................ 10-2018-0170527

(51) Int. Cl.
*H10K 50/844* (2023.01)
*H04N 23/54* (2023.01)
(Continued)

(52) U.S. Cl.
CPC ........... *H10K 50/844* (2023.02); *H04N 23/54* (2023.01); *H10K 59/00* (2023.02); *H10K 59/122* (2023.02); *H10K 77/10* (2023.02)

(58) Field of Classification Search
CPC ... H04N 5/2253; H04M 1/0264; H10K 59/13; H10K 59/60–771; H10K 59/87–8731
See application file for complete search history.

(56) References Cited

U.S. PATENT DOCUMENTS 9,632,487 B2     4/2017   Kim et al.
11,672,142 B2 *  6/2023   Lim ...................... H10K 77/10
                                                          313/512
(Continued)

FOREIGN PATENT DOCUMENTS

CN        106158881 A    11/2016
CN        107275335 A    10/2017
(Continued)

*Primary Examiner* — Mariceli Santiago
(74) *Attorney, Agent, or Firm* — Birch, Stewart, Kolasch & Birch, LLP

(57) ABSTRACT

A display device can include an organic light emitting device in a display area on a substrate, a thin film transistor being connected with the organic light emitting device, a protecting portion surrounding at least a portion of a camera area on the substrate, a dam structure disposed between the thin film transistor and the protecting portion, an encapsulation layer, and a hole in the camera area. The encapsulation layer can include a first encapsulation layer, a second encapsulation layer on the first encapsulation layer, and a third encapsulation layer on the second encapsulation layer. The hole can be provided inside the display area, and the first encapsulation layer and the third encapsulation layer are disposed on a side surface and an upper surface of the dam structure.

20 Claims, 12 Drawing Sheets

Related U.S. Application Data continuation of application No. 16/716,817, filed on Dec. 17, 2019, now Pat. No. 11,329,255.

(51) Int. Cl.
*H10K 59/00* (2023.01)
*H10K 59/122* (2023.01)
*H10K 77/10* (2023.01)

(56) References Cited

U.S. PATENT DOCUMENTS

| | | |
|---|---|---|
| 2012/0013900 A1 | 6/2012 | Lee et al. |
| 2014/0097430 A1 | 4/2014 | Park et al. |
| 2014/0098005 A1 | 4/2014 | Kim et al. |
| 2015/0041772 A1 | 2/2015 | Han |
| 2017/0148856 A1 | 5/2017 | Choi et al. |
| 2017/0288004 A1 | 10/2017 | Kim et al. |
| 2018/0151834 A1 | 5/2018 | Kanaya |
| 2018/0183015 A1 | 6/2018 | Yun et al. |
| 2018/0254431 A1 | 9/2018 | Kim |
| 2019/0148672 A1 | 5/2019 | Seo et al. |
| 2020/0006700 A1 | 1/2020 | Kim et al. |
| 2020/0238267 A1 | 7/2020 | Baniecki et al. |
| 2020/0273927 A1 | 8/2020 | Oh et al. |
| 2020/0343481 A1 | 10/2020 | Lee et al. |

FOREIGN PATENT DOCUMENTS

| | | |
|---|---|---|
| CN | 107275363 A | 10/2017 |
| CN | 107919293 A | 4/2018 |
| CN | 108039418 A | 5/2018 |
| CN | 108172593 A | 6/2018 |
| CN | 108666347 A | 10/2018 |
| CN | 109994657 A | 7/2019 |
| CN | 110224077 A | 9/2019 |
| CN | 110429118 A | 11/2019 |
| EP | 3486962 A2 | 5/2019 |
| EP | 3588574 A1 | 1/2020 |
| EP | 3 633 751 A1 | 4/2020 |
| JP | 2019-91039 A | 6/2019 |
| KR | 10-2017-0080311 A | 7/2017 |
| KR | 10-2020-0003328 A | 1/2020 |
| KR | 10-2020-0113957 A | 10/2020 |

* cited by examiner

DISPLAY DEVICE

CROSS-REFERENCE TO RELATED APPLICATIONS

This Application is a Continuation of U.S. patent application Ser. No. 17/710,426, filed on Mar. 31, 2022 (now U.S. Pat. No. 11,672,142, issued on Jun. 6, 2023), which is a Continuation of U.S. patent application Ser. No. 16/716,817, filed on Dec. 17, 2019 (now U.S. Pat. No. 11,329,255, issued on May 10, 2022), which claims the priority benefit of Korean Patent Application No. 10-2018-0170527 filed on Dec. 27, 2018, the entire contents of all these applications being hereby expressly incorporated by reference into the present application.

BACKGROUND

Field

The present disclosure relates to a display device, and more particularly, to a display device with a camera provided therein.

Discussion of the Related Art

A display apparatus includes various display devices such as a liquid crystal display device or an organic light emitting device in a display area. In these display devices, a method for applying various applications by the use of camera provided inside the display device and configured to interwork with the display area has been studied.

In order to provide the camera inside the display device, a camera hole for placing the camera in the display device has to be provided. Generally, the camera hole is obtained by a process of removing some areas from the display device through a laser-beam irradiation.

However, damages such as cracks may be generated in the process of removing some areas from the display device through the laser-beam irradiation. Furthermore, the cracks may extend to the display area so that it may cause problems such as degradation of picture quality and deterioration of the display device.

SUMMARY OF THE DISCLOSURE

The present disclosure has been made in view of the above problems and limitations associated with the related art, and it is an object of the present disclosure to provide a display device which is capable of preventing damages such as cracks, which might be generated when a camera hole is formed, from extending to a display area.

In accordance with an aspect of the present disclosure, the above and other objects can be accomplished by the provision of a display device comprising a hole area on a substrate, a buffer area configured to surround the hole area, and a display area configured to surround the buffer area, wherein the display area includes a thin film transistor including a gate electrode, a source electrode, and a drain electrode on the substrate, the buffer area is provided with a damage preventing portion configured to control damages generated in a process of forming the hole area from extending to the display area, and the damage preventing portion is formed of a same material as a material of the source and drain electrodes.

In accordance with another aspect of the present disclosure, there is provided a display device comprising a substrate, and a circuit device layer on the substrate, wherein the display device includes a hole area configured to penetrate through the substrate and the circuit device layer, and a buffer area configured to surround the hole area, a damage preventing portion is provided in the buffer area, and one lateral surface of the damage preventing portion confronting the hole area is formed in a groove structure toward a direction being farther away from the camera area.

According to one embodiment of the present disclosure, the buffer area is provided to surround the hole area, and the damage preventing portion is provided in the buffer area so that it is possible to prevent damages, which might be generated when the hole area is formed, from extending to the display area. Especially, according to one embodiment of the present disclosure, the damage preventing portion is formed of the same material as that of the source and drain electrodes in the display area, and is manufactured by the same patterning process as that of the source and drain electrodes in the display area, whereby it is unnecessary to carry out an additional process for forming the damage preventing portion, thereby realizing simplified manufacturing process and minimizing the increase of manufacturing cost.

Also, according to one embodiment of the present disclosure, the camera area and the buffer area are surrounded by the display area, whereby the size of the display area can be increased in comparison to the case where the camera area and the buffer area are surrounded by the non-display area positioned in the periphery of the display area.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE DISCLOSURE

Figure 1:
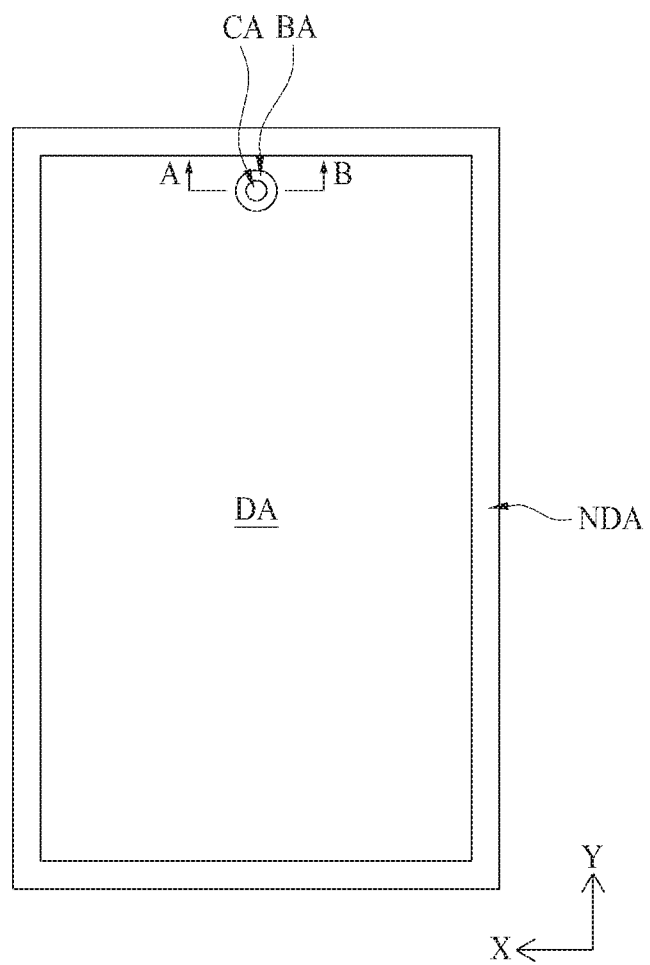
FIG. 1 is a rough plane view illustrating a display device according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part can be added unless 'only-' is used. The terms of a singular form can include plural forms unless referred to the contrary.

In construing an element, the element is construed as including an error range although there is no explicit description.

In describing a position relationship, for example, when the position relationship is described as 'upon-', 'above-', 'below-', and 'next to-', one or more portions can be arranged between two other portions unless 'just' or 'direct' is used.

In describing a time relationship, for example, when the temporal order is described as 'after-', 'subsequent-', 'next-', and 'before-', a case which is not continuous can be included unless 'just' or 'direct' is used.

It will be understood that, although the terms "first", "second", etc. can be used herein to describe various elements, these elements should not be limited by these terms. These terms are only used to distinguish one element from another. For example, a first element could be termed a second element, and, similarly, a second element could be termed a first element, without departing from the scope of the present disclosure.

It should be understood that the term "at least one" includes all combinations related with any one item. For example, "at least one among a first element, a second element and a third element" can include all combinations of two or more elements selected from the first, second and third elements as well as each element of the first, second and third elements.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in co-dependent relationship.

Hereinafter, the preferred embodiments of the present disclosure will be described in detail with reference to the accompanying drawings.

FIG. 1 is a rough plane view illustrating a display device according to one embodiment of the present disclosure. All the components of the display device according to all embodiments of the present disclosure are operatively coupled and configured. Further, the display device in all embodiments of the present disclosure can be any one of various displays used in a wide range of applications, such as smart phones, TVs, navigation devices, computers, security devices, remote devices, augmented reality devices, artificial intelligent-based devices, etc.

As shown in FIG. 1, the display device according to one embodiment of the present disclosure includes a display area (DA), a non-display area (NDA), a hole area (CA), and a buffer area (BA).

The display area (DA) is provided in a central portion of the display device, and an image is displayed on the display area (DA). In the display area (DA), various display devices which are generally known to those in the art, for example, an organic light emitting device or a liquid crystal display device can be provided therein. This image display device includes a plurality of pixels, wherein the plurality of pixels include a plurality of signal lines and a plurality of thin film transistors.

The non-display area (NDA) is provided in the periphery of the display area (DA). In the non-display area (NDA), there are a driver configured to supply various signals to the plurality of signal lines in the display area (DA), and a link portion configured to connect the driver with the plurality of signal lines. The driver includes a gate driver configured to supply a gate signal to a gate line, and a data driver configured to supply a data signal to a data line.

The hole area (CA) is provided inside the display area (DA). The hole area (CA) corresponds to the area where a camera is to be positioned, and an image is not displayed on the hole area (CA). The hole area (CA) can be formed in a circular shape.

The buffer area (BA) is provided between the hole area (CA) and the display area (DA). Especially, the buffer area (BA) is provided to surround the peripheral area of the hole area (CA) so that the buffer area (BA) can be formed in a shape corresponding to a shape of the hole area (CA). For example, the hole area (CA) is formed in a circle shape, the buffer area (BA) can be formed in a circular doughnut or tube shape.

As the buffer area (BA) separates the hole area (CA) and the display area (DA) from each other, it is possible to prevent the hole area (CA) from being influenced by the display area (DA), and also to prevent the display area (DA) from being influenced by the hole area (CA). In detail, the buffer area (BA) prevents an organic encapsulation layer formed in the display area (DA) from being permeated into the hole area (CA), and also prevents damages such as cracks which might be generated during a process of forming the hole area (CA) from being transferred to the display area (DA).

On the plane view, the hole area (CA) and the buffer area (BA) can be positioned in the center with respect to a first axis (for example, X-axis) of the display area (DA), or can be positioned between the center and one end (for example, upper end or lower end) with respect to a second axis (for example, Y-axis) of the display area, wherein the second axis is perpendicular to the first axis, especially, can be positioned adjacent to one end, but not necessarily.

The buffer area (BA) and the hole area (CA) can be provided inside the display area (DA) while being apart from the non-display area (NDA). That is, the buffer area (BA) is surrounded by the display area (DA), and the hole area (CA) is surrounded by the display area (DA) while the buffer area (BA) is interposed in-between.

When the hole area (CA) and the buffer area (BA) are provided in the non-display area (NDA), a size of the non-display area (NDA) is increased in the Y-axis direction, whereby a size of the display area (DA) is decreased by the increased size of the non-display area (NDA).

Meanwhile, according to one embodiment of the present disclosure, the hole area (CA) and the buffer area (BA) are surrounded by the display area (DA) so that a size of the display area (DA) is not decreased in the Y-axis direction.

In this disclosure, the hole area (CA) corresponds to the area where a hole for a camera to be placed therein is formed. Hereinafter, it will be explained on assumption that the hole area (CA) is a camera area (CA) where a camera is placed therein. In all embodiments, one or more cameras or camera components can be provided in the CA.

Hereinafter, the display device according to one embodiment of the present disclosure will be described in detail with reference to the cross-sectional structure.

Figure 2:
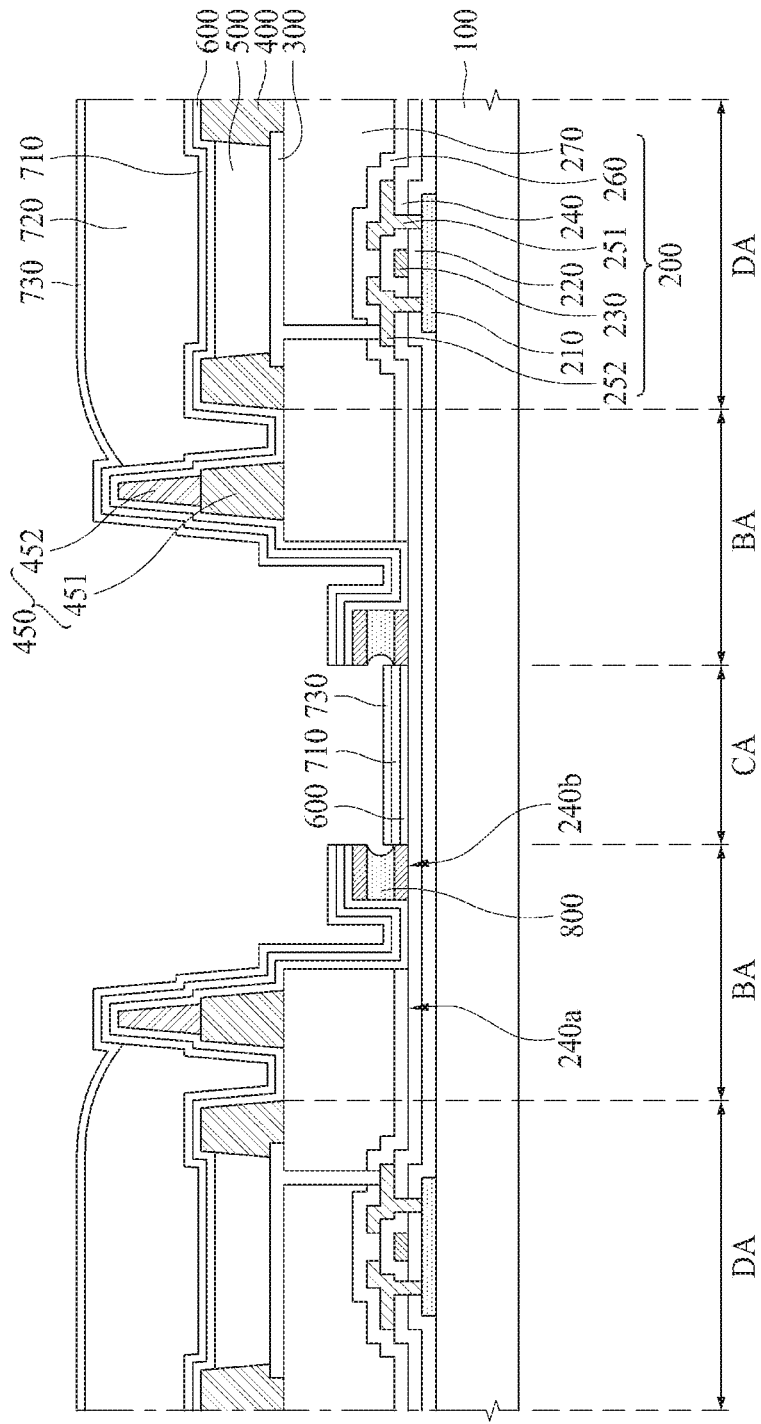
FIG. 2 is a rough cross-sectional view illustrating the display device according to one embodiment of the present disclosure, which corresponds to a cross section along line A-B of FIG. 1.

FIG. 2 is a rough cross-sectional view illustrating a display device according to one embodiment of the present disclosure, which corresponds to the cross-sectional view along line A-B of FIG. 1. FIG. 2 illustrates the display device including an organic light emitting device. Also, FIG. 2 shows the state before a camera hole is formed by a laser cutting process.

As shown in FIG. 2, the display device according to one embodiment of the present disclosure includes a display area (DA), a buffer area (BA), and a camera area (CA).

First, the display area (DA) will be described. On the display area (DA) of a substrate 100, there are a circuit device layer 200, a first electrode 300, a bank 400, an emission layer 500, a second electrode 600, and encapsulation layers 710, 720 and 730.

The substrate 100 can be formed of transparent glass or plastic, but is not limited to these materials. If the display device according to one embodiment of the present disclosure includes a top emission type organic light emitting device, the substrate 100 can be formed of an opaque material.

The circuit device layer 200 is provided on the substrate 100. In the circuit device layer 200, a circuit device including various signal lines, a thin film transistor, and a capacitor is provided for each pixel. The plurality of signal lines can include a gate line, a data line, a power line, and a reference line. The plurality of thin film transistors can include a switching thin film transistor, a driving thin film transistor, and a sensing thin film transistor. In FIG. 2, only the driving thin film transistor is shown in the circuit device layer 200.

The circuit device layer 200 includes an active layer 210, a gate insulating layer 220, a gate electrode 230, an insulating interlayer 240, a source electrode 251, a drain electrode 252, a passivation layer 260, and a planarization layer 270.

The active layer 210 is patterned on the substrate 100. The gate insulating layer 220 is formed between the active layer 210 and the gate electrode 230. The gate electrode 230 is overlapped with the active layer 210 while being formed on the gate insulating layer 220. The insulating interlayer 240 is provided between the gate electrode 230 and the source electrode 251, and also provided between the gate electrode 230 and the drain electrode 252. The source electrode 251 and the drain electrode 252 confront each other on the insulating interlayer 240. Also, the source electrode 251 and the drain electrode 252 are respectively connected with the active layer 210 through a contact hole provided in the insulating interlayer 240 and the gate insulating layer 220. The passivation layer 260 is formed on the source electrode 251 and the drain electrode 252, and the planarization layer 270 is formed on the passivation layer 260. Each of the gate insulating layer 220, the insulating interlayer 240, and the passivation layer 260 is formed of an inorganic insulating layer having a relatively small thickness, and the planarization layer 270 is formed of an organic insulating layer having a relatively large thickness. This structure of the driving thin film transistor can be changed in various types generally known to those in the art.

The first electrode 300 is patterned for each pixel while being provided on the circuit device layer 200. The first electrode 300 can function as an anode electrode of the organic light emitting device. The first electrode 300 is connected with the source electrode 251 of the driving thin film transistor through a contact hole provided in the passivation layer 260 and the planarization layer 270. If needed, the first electrode 300 can be connected with the drain electrode 252 of the driving thin film transistor through a contact hole provided in the passivation layer 260 and the planarization layer 270.

The bank 400 is formed in the boundaries between each of the pixels while being provided on the circuit device layer 200 and being configured to cover the edges of the first electrode 300. An exposed portion of the first electrode 300, which is exposed without being covered by the bank 400, forms an emission area.

The emission layer 500 is formed on the first electrode 300. The emission layer 500 can be provided to emit white light. To this end, the emission layer 500 can comprise a plurality of stacks for emitting different-colored light. For example, the emission layer 500 can include a first stack for emitting blue colored light, a second stack for emitting yellow-green colored light, and a charge generation layer provided between the first stack and the second stack. The emission layers 500 for emitting white light can be connected with each other in the plurality of pixels. Meanwhile, the emission layer 500 can include a blue emission layer, a green emission layer, and a red emission layer which are patterned while being separated from each other in the plurality of pixels.

The second electrode 600 is provided on the emission layer 500. The second electrode 600 can function as a cathode of the organic light emitting device. The second electrodes 600 can be connected with each other in the plurality of pixels.

The encapsulation layer 710, 720 and 730 is provided on the second electrode 600. The encapsulation layer 710, 720 and 730 can include the first encapsulation layer 710, the second encapsulation layer 720, and the third encapsulation layer 730. The first encapsulation layer 710 is provided on the second electrode 600, the second encapsulation layer 720 is provided on the first encapsulation layer 710, and the third encapsulation layer 730 is provided on the second encapsulation layer 720. The first encapsulation layer 710 and the third encapsulation layer 730 are formed of inorganic insulating layers, and prevent external moisture from being permeated into the emission layer 500. The second encapsulation layer 720 is formed of an organic insulating layer, and absorbs externally-permeated moisture so as to prevent moisture permeation into the emission layer 500. Also, the second encapsulation layer 720 covers an external particle and also absorbs an external shock.

The buffer area (BA) will be described as follows. On the buffer area (BA) of the substrate 100, there are the gate insulating layer 220, the insulating interlayer 240, the passivation layer 260, the planarization layer 270, a dam structure 450, the second electrode 600, the encapsulation layer 710, 720 and 730, and a damage preventing portion 800.

In the buffer area (BA), inorganic insulating layers or organic insulating layers such as the gate insulating layer 220, the insulating interlayer 240, the passivation layer 260, and the planarization layer 270 constituting the circuit device layer 200 can be formed, and the aforementioned thin film transistor is not formed. And, other circuit devices may not be provided in the buffer area (BA).

The gate insulating layer 220 and the insulating interlayer 240 can be provided in the entire buffer area (BA). However, the passivation layer 260 and the planarization layer 270 can be provided in only some areas of the buffer area (BA), but may not be provided in the remaining areas of the buffer area (BA). Accordingly, a first upper surface 240a of the insulating interlayer 240 in the buffer area (BA) is covered by the passivation layer 260 and the planarization layer 270, and a second upper surface 240b of the insulating interlayer 240 in the buffer area (BA) is exposed without being covered by the passivation layer 260 and the planarization layer 270.

The dam structure 450 is provided on the planarization layer 270. For example, the dam structure 450 is overlapped with the first upper surface 240a of the insulating interlayer 240. The dam structure 450 prevents the second encapsulation layer 720 of the organic material from flowing into the camera area (CA). The second encapsulation layer 720 of a liquid type can be coated onto the first encapsulation layer 710. In this case, if the second encapsulation layer 720 of the liquid type flows to the camera area (CA), a laser cutting process to be performed later in the camera area (CA) might be difficult.

Thus, according to one embodiment of the present disclosure, the dam structure 450 is formed in the buffer area (BA) so that it is possible to prevent the second encapsulation layer 720 from flowing into the camera area (CA). Eventually, since the second encapsulation layer 720 is not provided in the corresponding areas from the area overlapped with the dam structure 450 to the area overlapped with the damage preventing portion 800, a lower surface of the third encapsulation layer 730 is brought into contact with an upper surface of the first encapsulation layer 710 in the corresponding areas where the second encapsulation layer 720 is not provided.

The dam structure 450 can include a first dam structure 451 and a second dam structure 452. The first dam structure 451 and the bank 400 can be formed of the same material, and can be patterned at the same height. The second dam structure 452 is provided on the first dam structure 451 so that it is possible to increase an entire height of the dam structure 450. A width in a lower surface of the second dam structure 452 can be smaller than a width in an upper surface of the first dam structure 451, but is not limited to this structure.

The second electrode 600 can be formed in the entire buffer area (BA). In detail, the second electrode 600 can extend from the area above the upper surface of the planarization layer 270 to the area above the second upper surface 240b of the insulating interlayer 240 and the upper surface of the damage preventing portion 800 along the upper surface of the dam structure 450 and the lateral surface of the planarization layer 270.

Among the encapsulation layers 710, 720 and 730, the second encapsulation layer 720 is blocked by the dam structure 450, whereby the second encapsulation layer 720 can extend only to the front of the dam structure 450, and more particularly, to the front of the dam structure 450 corresponding to an opposite area of the camera area (CA). Meanwhile, the first encapsulation layer 710 and the third encapsulation layers 730 can be provided in the entire buffer area (BA). Accordingly, the first encapsulation layer 710 extends along the upper surface of the second electrode 600 on the upper surface of the second electrode 600, and the third encapsulation layer 730 extends along the upper surface of the first encapsulation layer 710 on the upper surface of the first encapsulation layer 710. Thus, each of the first encapsulation layer 710 and the third encapsulation layer 730 can be overlapped with the planarization layer 270, the dam structure 450, the second upper surface 240b of the insulating interlayer 240, and the damage preventing portion 800.

The damage preventing portion 800 is provided while being in contact with the second upper surface 240b of the insulating interlayer 240. Thus, the damage preventing portion 800 is not overlapped with the planarization layer 270 of the organic insulating layer having the large thickness.

In the same manner as the above source electrode 251 and drain electrode 252 of the display area (DA), the damage preventing portion 800 is provided on the insulating interlayer 240. Thus, the damage preventing portion 800 can be formed of the same material as that of the source electrode 251 and the drain electrode 252, and can be patterned by the same process as that of the source electrode 251 and the drain electrode 252. According to one embodiment of the present disclosure, the damage preventing portion 800 is formed of the same material as that of the source electrode 251 and the drain electrode 252, and patterned by the same process as that of the source electrode 251 and the drain electrode 252, whereby it is unnecessary to carry out an additional process for forming the damage preventing portion 800, thereby realizing a simplified manufacturing process and minimizing the increase of manufacturing cost.

The damage preventing portion 800 is formed to be in contact with the boundaries between the buffer area (BA) and the camera area (CA). Owing to the damage preventing portion 800, it is possible to prevent damages such as cracks which might be generated in the camera area (CA) from extending to the display area (DA) through the buffer area (BA). In more detail, when the camera hole is formed in the camera area (CA) by the laser cutting process, damages such as cracks might be generated in at least one among the second electrode 600, the first encapsulation layer 710, and the third encapsulation layer 730 formed in the camera area (CA) during the laser cutting process, and the damages such as cracks might extend to the display area (DA) through the buffer area (BA). If the cracks formed in the second electrode 600 extend to the display area (DA), the emission is not smoothly generated in the emission layer 500. Furthermore, if the cracks formed in the first encapsulation layer 710 and the third encapsulation layer 730 extend to the display area (DA), external moisture can be permeated through the generated cracks, whereby it accelerates deterioration of the emission layer 500. Thus, according to one embodiment of the present disclosure, the damage preventing portion 800 is formed in the buffer area (BA) so that it is possible to prevent the cracks, which might occur in the camera area (CA) during the laser cutting process, from extending to the display area (DA).

The damage preventing portion 800 is configured to disconnect (or separate) the second electrode 600, the first encapsulation layer 710, and the third encapsulation layer 730 formed thereon in the buffer area (BA) from the second electrode 600, the first encapsulation layer 710, and the third encapsulation layer 730 formed thereon in the camera area (CA). For instance, the second electrode 600, the first encapsulation layer 710, and the third encapsulation layer 730 formed in the buffer area (BA) are disconnected from the second electrode 600, the first encapsulation layer 710, and the third encapsulation layer 730 formed in the camera area (CA) by the use of damage preventing portion 800. Even though the damages such as cracks may occur in at least one among the second electrode 600, the first encapsulation layer 710, and the third encapsulation layer formed in the camera area (CA), the damages can hardly extend to the buffer area (BA).

Hereinafter, a structure of the damage preventing portion 800 configured to disconnect the second electrode 600, the first encapsulation layer 710, and the third encapsulation layer 730 formed in the buffer area (BA) from the second electrode 600, the first encapsulation layer 710, and the third encapsulation layer 730 formed in the camera area (CA) according to various embodiments of the present disclosure will be described with reference to FIGS. 3 and 4.

The camera area (CA) will be described as follows. On the camera area (CA) of the substrate 100, there are the gate insulating layer 220, the insulating interlayer 240, the second electrode 600, the first encapsulation layer 710, and the third encapsulation layer 730.

In the camera area (CA), the passivation layer 260 and the planarization layer 270 are not formed so that it facilitates to form the camera hole by the laser cutting process to be performed later. The gate insulating layer 220 and the insulating interlayer 240 formed in the camera area (CA) are respectively connected with the gate insulating layer 220 and the insulating interlayer 240 formed in the buffer area (BA) and the display area (DA). However, the second electrode 600, the first encapsulation layer 710, and the third encapsulation layer 730 formed in the camera area (CA) are not connected with the second electrode 600, the first encapsulation layer 710, and the third encapsulation layer 730 formed in the buffer area (BA) and the display area (DA).

Figure 3:
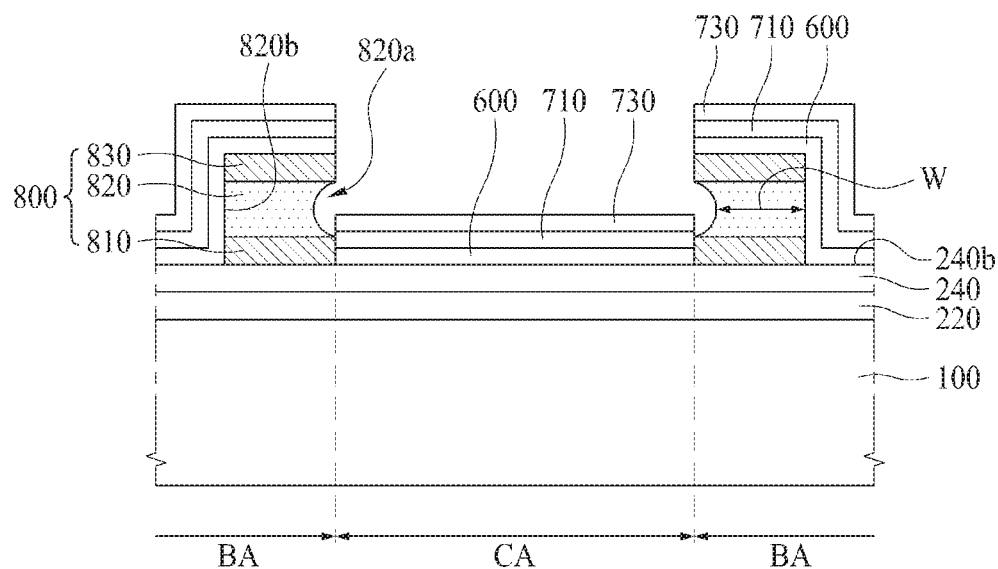
FIG. 3 is a rough cross-sectional view illustrating a buffer area and a camera area in the display device according to one embodiment of the present disclosure.

FIG. 3 is a rough cross-sectional view illustrating the buffer area (BA) and the camera area (CA) in the display device according to one embodiment of the present disclosure, which shows the cross-sectional structure of the damage preventing portion 800 according to one embodiment of the present disclosure. FIG. 3 shows the state before the camera hole is formed by the laser cutting process.

As shown in FIG. 3, according to one embodiment of the present disclosure, the damage preventing portion 800 can include a first layer 810, a second layer 820, and a third layer 830. The second layer 820 is provided on the first layer 810, and the third layer 830 is provided on the second layer 820.

The damage preventing portion 800 can be formed of the same material as that of the source electrode 251 and drain electrode 252 of the aforementioned display area (DA), and can be provided in the same layer as that of the source electrode 251 and drain electrode 252 of the aforementioned display area (DA), whereby each of the source electrode 251 and the drain electrode 252 can have a three-layered structure in the same manner as the damage preventing portion 800. If the damage preventing portion 800 is formed of the same material as that of the source electrode 251 and drain electrode 252, the first layer 810, the second layer 820, and the third layer 830 can be formed of a conductive material. In this case, the first layer 810 and the third layer 830 respectively cover lower and upper surfaces of the second layer 820 so that it is possible to prevent corrosion of the second layer 820. To this end, the first layer 810 and the third layer 830 can be formed of a material with relatively-low oxidation degree and relatively-high corrosion resistance in comparison to the second layer 820. Also, the second layer 820 can be formed of a material with relatively-low resistance in comparison to the first layer 810 and the third layer 830. In order to lower the total resistance in the three-layered structure, a thickness of the second layer 820 is relatively larger than a thickness of each of the first layer 810 and the third layer 830.

Owing to the damage preventing portion 800, the second electrode 600, the first encapsulation layer 710, and the third encapsulation layer 730 provided in the buffer area (BA) are disconnected from the second electrode 600, the first encapsulation layer 710, and the third encapsulation layer 730 provided in the camera area (CA). In detail, the second electrode 600, the first encapsulation layer 710, and the third encapsulation layer 730 provided on the damage preventing portion 800 in the buffer area (BA) are disconnected from the second electrode 600, the first encapsulation layer 710, and the third encapsulation layer 730 provided on the damage preventing portion 800 in the camera area (CA).

To this end, a first lateral surface 820a of the second layer 820 confronting the camera area (CA) is provided in a groove structure toward an inner direction, and more particularly, toward the direction being gradually farther-away from the camera area (CA). Especially, the groove structure is provided with a curved-line structure having a predetermined inclination in the first lateral surface 820a of the second layer 820.

If the first lateral surface 820a of the second layer 820 is provided in the groove structure, the second electrode 600, the first encapsulation layer 710, and the third encapsulation layer 730 are not sequentially deposited on the groove structure of the first lateral surface 820a of the second layer 820, and can be provided in the disconnected structure.

Meanwhile, a width (W) of the second layer 820, and more particularly, a width (W) between the first lateral surface 820a of the second layer 820 confronting the camera area (CA) and a second lateral surface 820b opposite to the first lateral surface 820a is gradually decreased as it goes from its upper portion to its central portion, and is then gradually increased as it goes from its central portion to its lower portion, whereby it is possible to realize a stable deposition structure in the first layer 810 and the third layer 830 respectively provided below and above the second layer 820.

Figure 4:
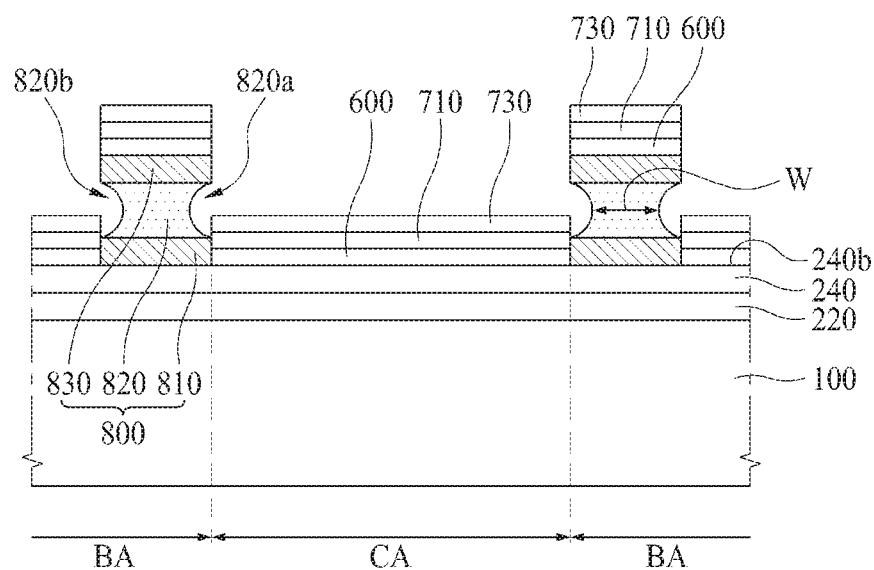
FIG. 4 is a rough cross-sectional view illustrating a buffer area and a camera area in a display device according to another embodiment of the present disclosure.

FIG. 4 is a rough cross-sectional view illustrating a buffer area (BA) and a camera area (CA) in a display device according to another embodiment of the present disclosure, which shows a cross-sectional structure of a damage preventing portion 800 according to another embodiment of the present disclosure. FIG. 4 shows the state before a camera hole is formed by a laser cutting process.

In case of the damage preventing portion 800 of FIG. 4, both a first lateral surface 820a and a second lateral surface 820b in a second layer 820 are formed in groove structures. In this respect, the damage preventing portion of FIG. 4 is different from the damage preventing portion of FIG. 3.

Referring to FIG. 4, the first lateral surface 820*a* of the second layer 820 confronting a camera area (CA) is provided in the groove structure toward an inner direction, and more particularly, the direction being gradually farther-away from the camera area (CA). Also, the second lateral surface 820*b* of the second layer 820, which corresponds to the opposite lateral surface to the first lateral surface 820*a*, is provided in the groove structure toward the inner direction, and more particularly, the direction being gradually close to the camera area (CA). Especially, the groove structure is provided with a curved-line structure having a predetermined inclination in both the first lateral surface 820*a* and the second lateral surface 820*b* of the second layer 820.

Thus, according to another embodiment of the present disclosure, the second lateral surface 820*b* of the second layer 820 is formed in the groove structure, whereby a second electrode 600, a first encapsulation layer 710, and a third encapsulation layer 730 provided on an upper surface of the damage preventing portion 800 are disconnected from a second electrode 600, a first encapsulation layer 710, and a third encapsulation layer 730 provided on some areas of the buffer area (BA) being not overlapped with the damage preventing portion 800, and more particularly, provided on a second upper surface 240*b* of an insulating interlayer 240 in the buffer area (BA). Thus, it is possible to prevent damages such as cracks, which might be generated in the camera area (CA), from extending to the display area (DA) via the buffer area (BA).

Meanwhile, in the structures of FIG. 3 and FIG. 4, the damage preventing portion 800 can be formed in a single-layered structure having only the second layer 820 without the first layer 810 and the third layer 830.

Figure 5:
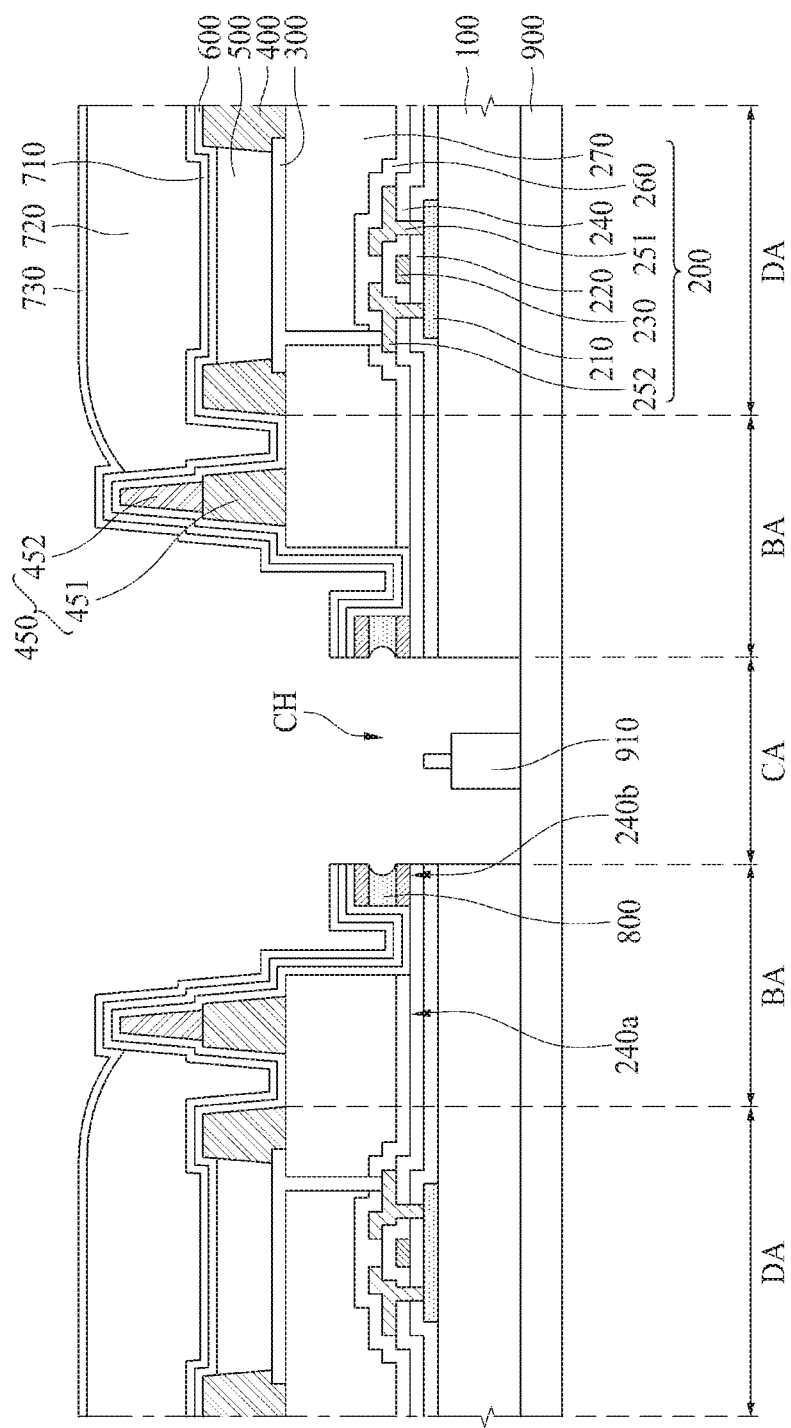
FIG. 5 is a rough cross-sectional view illustrating a display device according to another embodiment of the present disclosure, wherein a camera hole is formed by applying a laser cutting process to the display device of FIG. 2, and a camera is placed in the camera hole.

FIG. 5 is a rough cross-sectional view illustrating a display device according to another embodiment of the present disclosure, wherein a camera hole is formed by applying a laser cutting process to the display device of FIG. 2, and a camera is placed in the camera hole. Accordingly, the same reference numbers will be used throughout the drawings to refer to the same or like parts, and only different structures will be described in detail.

As shown in FIG. 5, a display area (DA) and a buffer area (BA) on a substrate 100 are the same as those of FIG. 2. However, a camera area (CA) on the substrate 100 is different from that of FIG. 2. In detail, the substrate 100, a gate insulating layer 220, an insulating interlayer 240, a second electrode 600, a first encapsulation layer 710, and a third encapsulation layer 730 provided in the camera area (CA) are removed by a laser cutting process.

Accordingly, the camera area (CA) is provided with a camera hole (CH) penetrating through the area from the substrate 100 to the third encapsulation layer 730, and a camera 910 is placed in the camera hole (CH). Thus, the camera 910 is provided while being confronted with the substrate 100 on the same plane as that of the substrate 100 in the buffer area (BA).

Also, a supporting portion 900 for supporting the camera 910 is provided below the substrate 100. The supporting portion 900 can be provided in the entire areas of the display area (DA), the buffer area (BA), and the camera area (CA). The supporting portion 900 can function as an external case.

Figure 6:
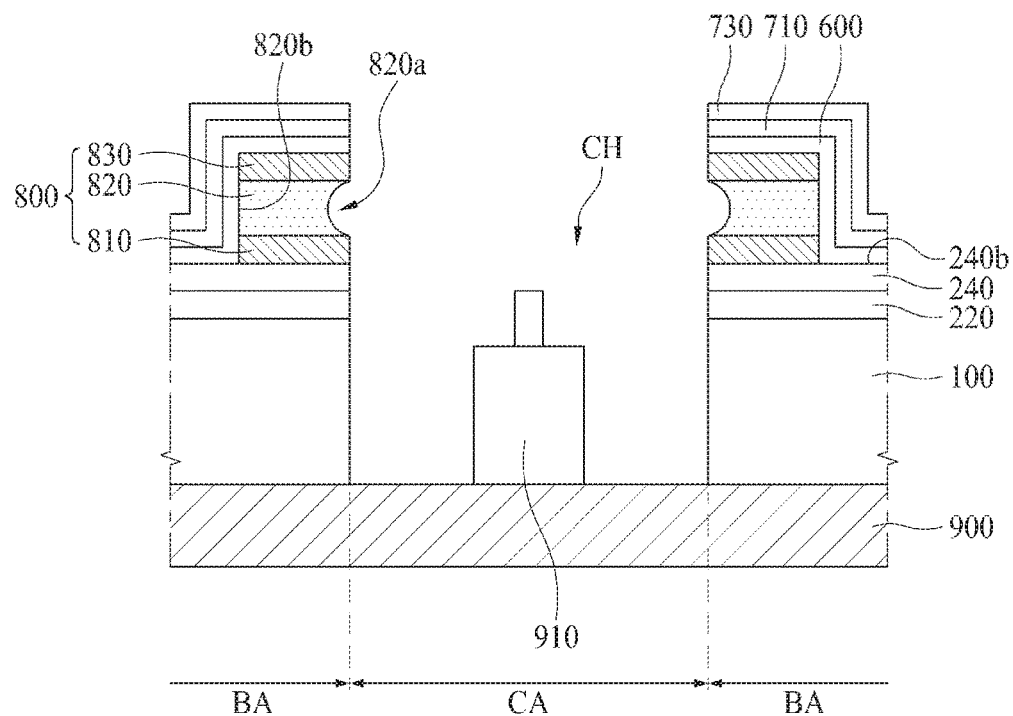
FIG. 6 is a rough cross-sectional view illustrating a buffer area and a camera area in a display device according to another embodiment of the present disclosure.

FIG. 6 is a rough cross-sectional view illustrating a buffer area and a camera area in a display device according to another embodiment of the present disclosure, which shows one case where a camera hole (CH) is formed by applying a laser cutting process to the display device with the damage preventing portion 800 of FIG. 3, and a camera 910 is placed in the camera hole.

Figure 7:
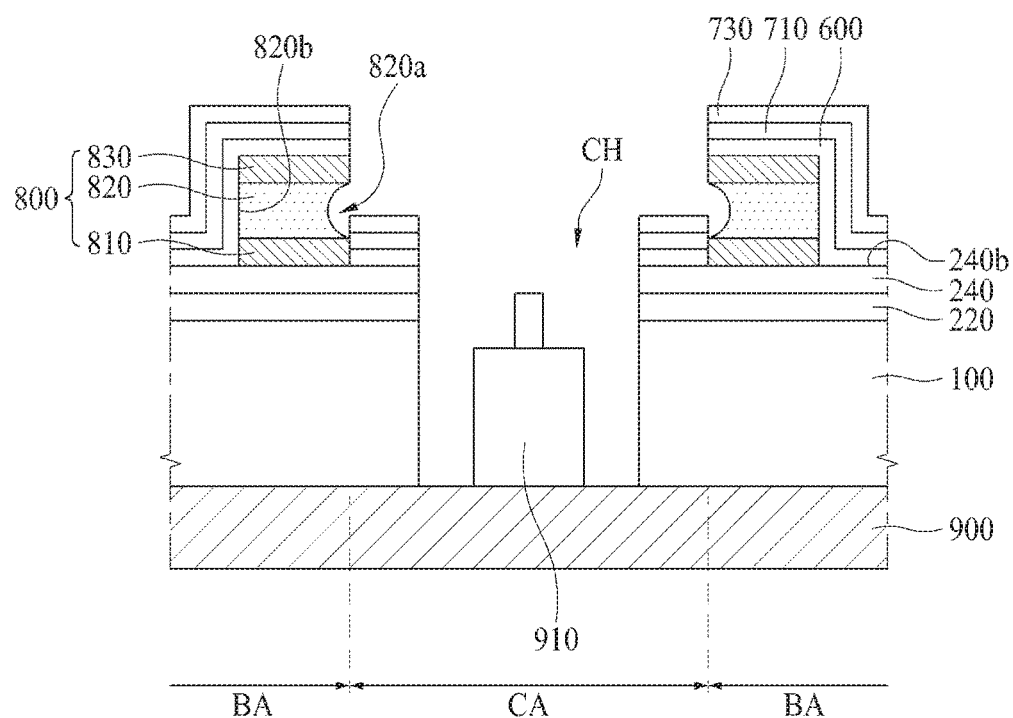
FIG. 7 is a rough cross-sectional view illustrating a buffer area and a camera area in a display device according to another embodiment of the present disclosure.

FIG. 7 is a rough cross-sectional view illustrating a buffer area and a camera area in a display device according to another embodiment of the present disclosure, which shows another case where a camera hole (CH) is formed by applying a laser cutting process to the display device with the damage preventing portion 800 of FIG. 3, and a camera 910 is placed in the camera hole.

In case of FIG. 6, in the above display device with the damage preventing portion 800 of FIG. 3, a camera hole (CH) is configured to penetrate through the entire areas including a substrate 100, a gate insulating layer 220, an insulating interlayer 240, a second electrode 600, a first encapsulation layer 710, and a third encapsulation layer 730 in a camera area (CA).

Thus, referring to FIG. 6, the camera hole (CH) is formed in the entire camera area (CA), a camera 910 is placed in the camera hole (CH), and a supporting portion 900 for supporting the camera 910 is provided below the substrate 100. Accordingly, the damage preventing portion 800 provided in a buffer area (BA) is brought into contact with the camera hole (CH). Also, the camera 910 confronts the substrate 100 of the buffer area (BA).

Meanwhile, referring to FIG. 7, in the display device with the damage preventing portion 800 of FIG. 3, a camera hole (CH) is configured to penetrate through some areas of a substrate 100, a gate insulating layer 220, an insulating interlayer 240, a second electrode 600, a first encapsulation layer 710, and a third encapsulation layer 730 provided in a camera area (CA).

Thus, in case of FIG. 7, each of the substrate 100, the gate insulating layer 220, the insulating interlayer 240, the second electrode 600, the first encapsulation layer 710, and the third encapsulation layer 730 provided in the buffer area (BA) extends to the camera area (CA). That is, the above substrate 100, the gate insulating layer 220, the insulating interlayer 240, the second electrode 600, the first encapsulation layer 710, and the third encapsulation layer 730 extended to the camera area (CA) remain without being removed by a laser cutting process.

Referring to FIG. 7, the camera hole (CH) is provided in some areas of the camera area (CA), a camera 910 is placed in the camera hole (CH), and a supporting portion 900 for supporting the camera 910 is provided below the substrate 100. Accordingly, the damage preventing portion 800 provided in a buffer area (BA) is not in contact with the camera hole (CH), and the substrate 100, the gate insulating layer 220, the insulating interlayer 240, the second electrode 600, the first encapsulation layer 710, and the third encapsulation layer 730 are provided between the damage preventing portion 800 and the camera hole (CH). Also, the camera 910 confronts the substrate 100 extended to the camera area (CA).

As described above in FIG. 6, if a processing error is generated under the condition that the camera hole (CH) is formed in the entire camera area (CA), the camera hole (CH) can invade the buffer area (BA). Thus, in case of FIG. 7, the camera area (CA) is designed to be larger than the camera hole (CH) in consideration of processing margin so that it is possible to prevent the invasion of the camera hole (CH) to the buffer area (BA).

Figure 8:
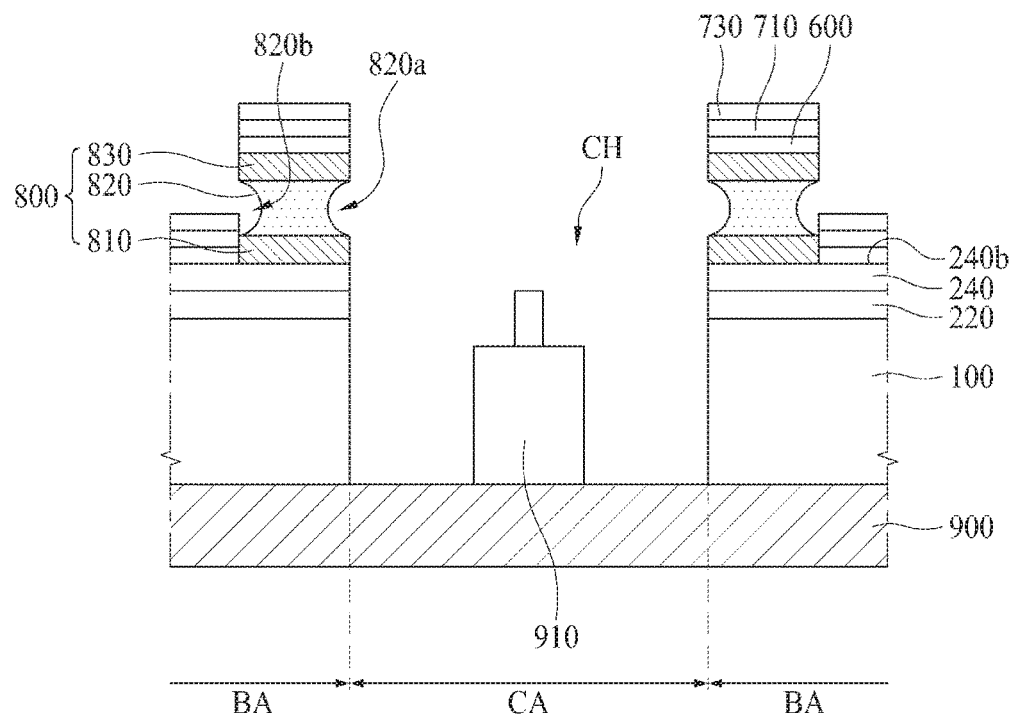
FIG. 8 is a rough cross-sectional view illustrating a buffer area and a camera area in a display device according to another embodiment of the present disclosure.

FIG. 8 is a rough cross-sectional view illustrating a buffer area and a camera area in a display device according to another embodiment of the present disclosure, which shows one case where a camera hole (CH) is formed by applying a laser cutting process to the display device with the damage preventing portion 800 of FIG. 4, and a camera 910 is placed in the camera hole.

Figure 9:
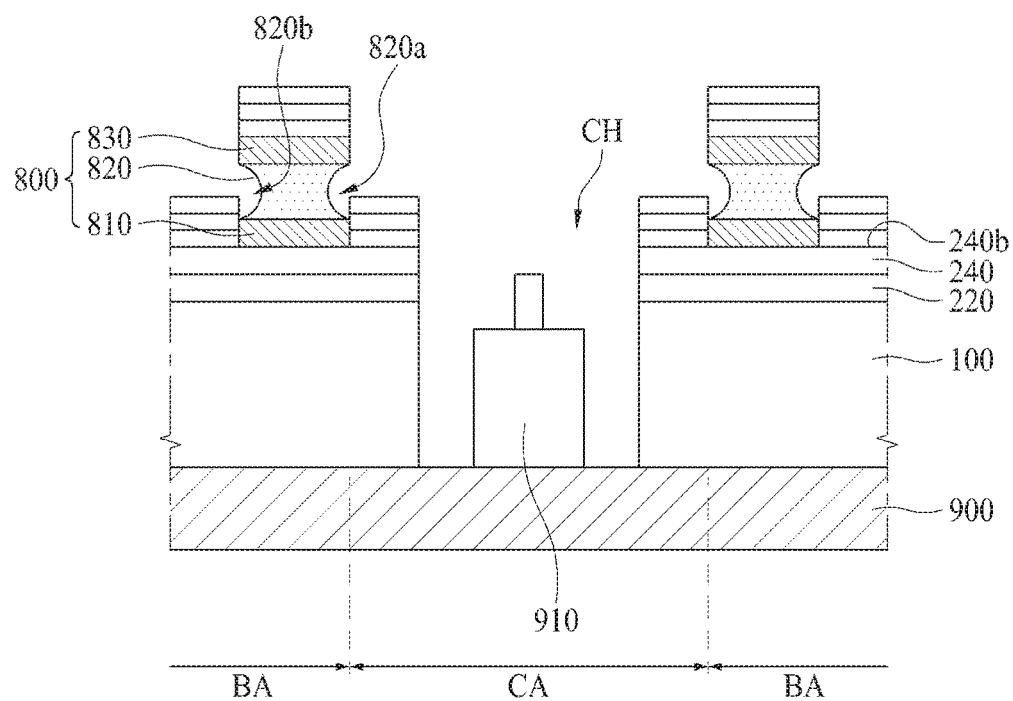
FIG. 9 is a rough cross-sectional view illustrating a buffer area and a camera area in a display device according to another embodiment of the present disclosure.

FIG. 9 is a rough cross-sectional view illustrating a buffer area and a camera area in a display device according to another embodiment of the present disclosure, which shows another case where a camera hole (CH) is formed by applying a laser cutting process to the display device with the damage preventing portion 800 of FIG. 4, and a camera 910 is placed in the camera hole.

In case of FIG. 8, in the above display device with the damage preventing portion 800 of FIG. 4, a camera hole (CH) is configured to penetrate through entire areas of a substrate 100, a gate insulating layer 220, an insulating interlayer 240, a second electrode 600, a first encapsulation layer 710, and a third encapsulation layer 730 provided in a camera area (CA).

Thus, referring to FIG. 8, the camera hole (CH) is formed in the entire camera area (CA), a camera 910 is placed in the camera hole (CH), and a supporting portion 900 for supporting the camera 910 is provided below the substrate 100. Accordingly, the damage preventing portion 800 provided in a buffer area (BA) is brought into contact with the camera hole (CH). Also, the camera 910 confronts the substrate 100 of the buffer area (BA).

Meanwhile, referring to FIG. 9, in the display device with the damage preventing portion 800 of FIG. 4, a camera hole (CH) is configured to penetrate through some areas of a substrate 100, a gate insulating layer 220, an insulating interlayer 240, a second electrode 600, a first encapsulation layer 710, and a third encapsulation layer 730 provided in a camera area (CA).

Thus, in case of FIG. 9, each of the substrate 100, the gate insulating layer 220, the insulating interlayer 240, the second electrode 600, the first encapsulation layer 710, and the third encapsulation layer 730 provided in the buffer area (BA) extends to the camera area (CA). That is, the above substrate 100, the gate insulating layer 220, the insulating interlayer 240, the second electrode 600, the first encapsulation layer 710, and the third encapsulation layer 730 extended to the camera area (CA) remain without being removed by a laser cutting process.

Referring to FIG. 9, the camera hole (CH) is provided in some areas of the camera area (CA), a camera 910 is placed in the camera hole (CH), and a supporting portion 900 for supporting the camera 910 is provided below the substrate 100. Accordingly, the damage preventing portion 800 provided in a buffer area (BA) is not in contact with the camera hole (CH), and the substrate 100, the gate insulating layer 220, the insulating interlayer 240, the second electrode 600, the first encapsulation layer 710, and the third encapsulation layer 730 are provided between the damage preventing portion 800 and the camera hole (CH). Also, the camera 910 confronts the substrate 100 extended to the camera area (CA).

As described above in FIG. 8, if a processing error is generated under the condition that the camera hole (CH) is formed in the entire camera area (CA), the camera hole (CH) can invade the buffer area (BA). Thus, in case of FIG. 9, the camera area (CA) is designed to be larger than the camera hole (CH) in consideration of processing margin so that it is possible to prevent the invasion of the camera hole (CH) to the buffer area (BA).

Figure 10:
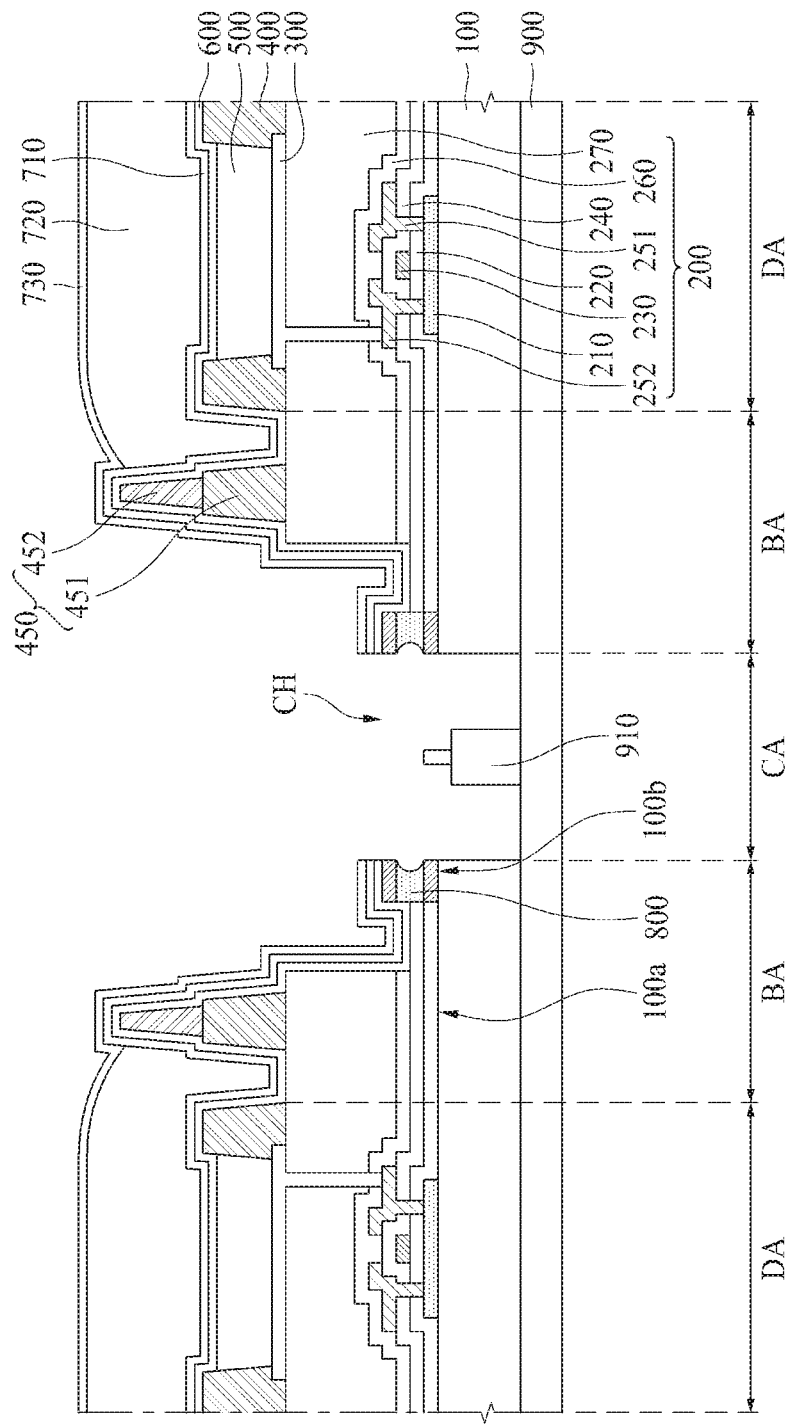
FIG. 10 is a rough cross-sectional view illustrating a display device according to another embodiment of the present disclosure.

FIG. 10 is a rough cross-sectional view illustrating a display device according to another embodiment of the present disclosure. Except a position of a damage preventing portion 800, the display device of FIG. 10 is identical in structure to the display device of FIG. 5. Accordingly, the same reference numbers will be used throughout the drawings to refer to the same or like parts, and only different structures will be described in detail.

Referring to above FIG. 5, the damage preventing portion 800 is brought into contact with the second upper surface 240b of the insulating interlayer 240. Meanwhile, in case of FIG. 10, the damage preventing portion 800 is brought into contact with a second upper surface 100b of a substrate 100.

That is, referring to FIG. 10, a gate insulating layer 220, an insulating interlayer 240, a passivation layer 260, and a planarization layer 270 are provided in some areas of a buffer area (BA), and not provided in the remaining areas of the buffer area (BA). Thus, a first upper surface 100a of the substrate 100 in the buffer area (BA) is covered by the gate insulating layer 220, the insulating interlayer 240, the passivation layer 260, and the planarization layer 270, however, the second upper surface 100b of the substrate 100 in the buffer area (BA) is exposed without being covered by the gate insulating layer 220, the insulating interlayer 240, the passivation layer 260, and the planarization layer 270. Accordingly, the damage preventing portion 800 is formed on the second upper surface 100b of the substrate 100.

In the structure of FIG. 10, the gate insulating layer 220 and the insulating interlayer 240 are not provided in the camera area (CA) before a laser cutting process so that it is possible to smoothly perform the laser cutting process with easiness.

The structures of the buffer area (BA) and the camera area (CA) shown in FIGS. 6 to 8 can be identically applied to the structure of FIG. 10.

Figure 11:
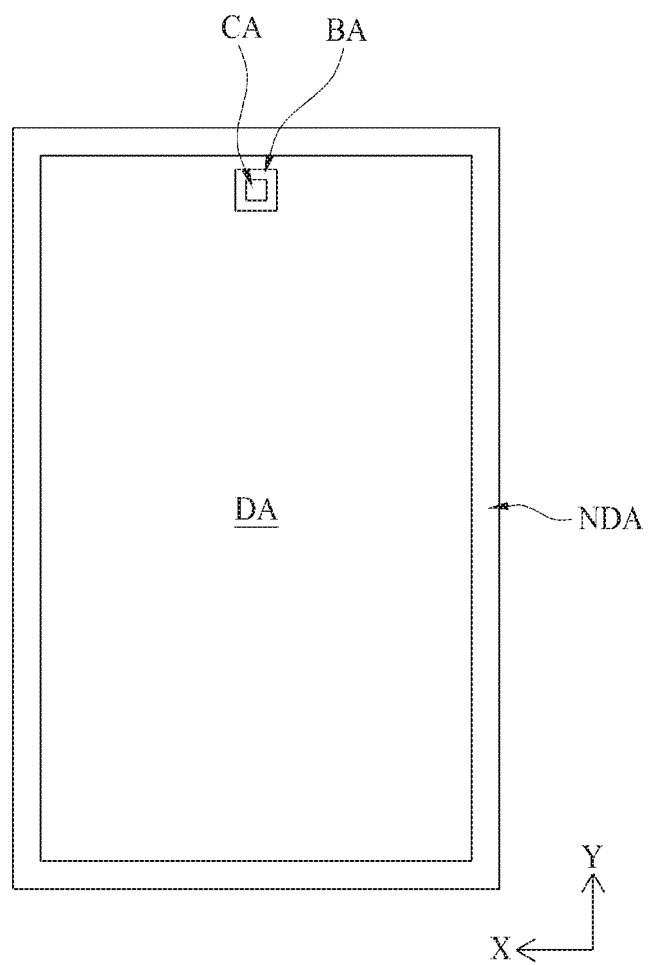
FIGS. 11 to 13 are rough plane views illustrating display devices according to various embodiments of the present disclosure.
Figure 12:
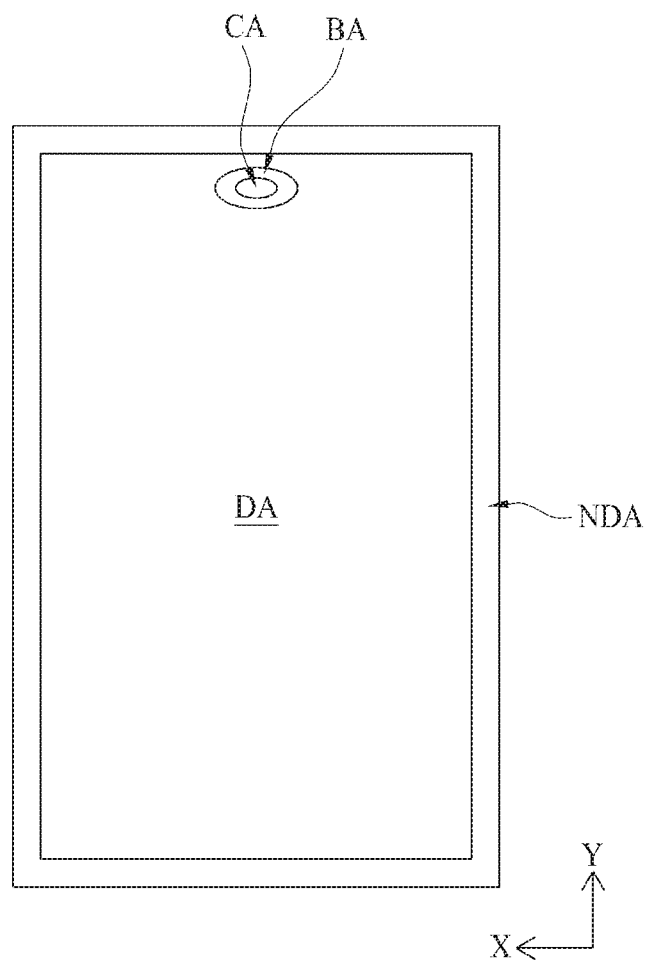
Figure 13:
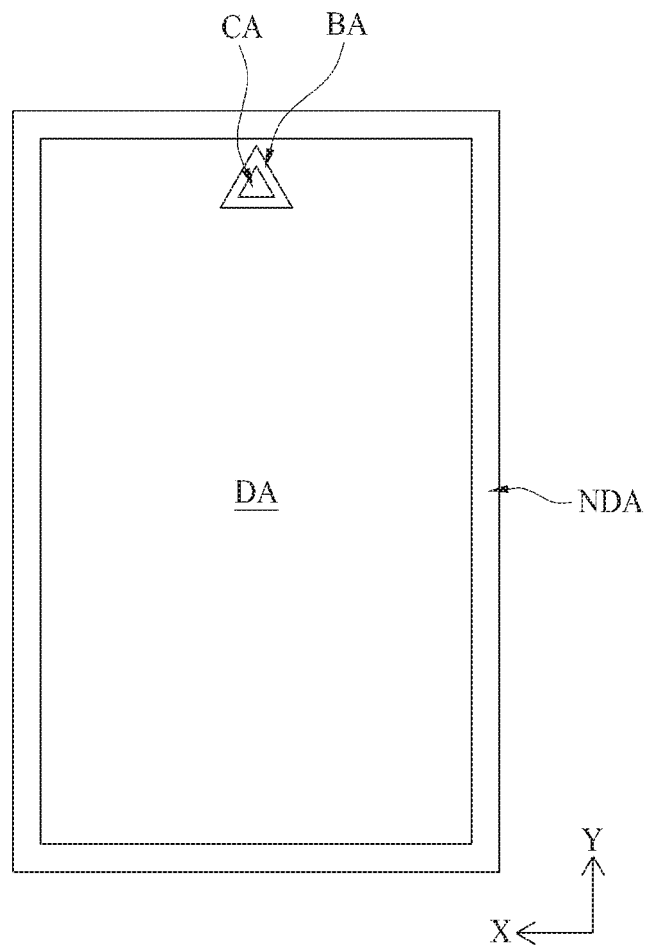

FIGS. 11 to 13 are rough plane views illustrating display devices according to various embodiments of the present disclosure. A structure of a camera area (CA) and a buffer area (BA) on the plane shown in FIGS. 11 to 13 is different from that of FIG. 1.

Referring to above FIG. 1, the camera area (CA) is formed in the circle shape, the buffer area (BA) is formed in the circular doughnut or tube shape to surround the camera area (CA).

Meanwhile, in case of FIG. 11, the camera area (CA) is formed in a rectangular shape, and the buffer area (BA) is formed in a rectangular doughnut or tube shape to surround the camera area (CA). Also, in case of FIG. 12, the camera area (CA) is formed in an oval shape, and the buffer area (BA) is formed in an oval-type doughnut or tube shape to surround the camera area (CA). Also, in case of FIG. 13, the camera area (CA) is formed in a triangular shape, and the buffer area (BA) is formed in a triangular doughnut or tube shape to surround the camera area (CA). The camera area (CA) is formed in a pentagonal or polygonal shape, and the buffer area (BA) is formed in a pentagonal or polygonal doughnut or tube shape to surround the camera area (CA).

Figure 14:
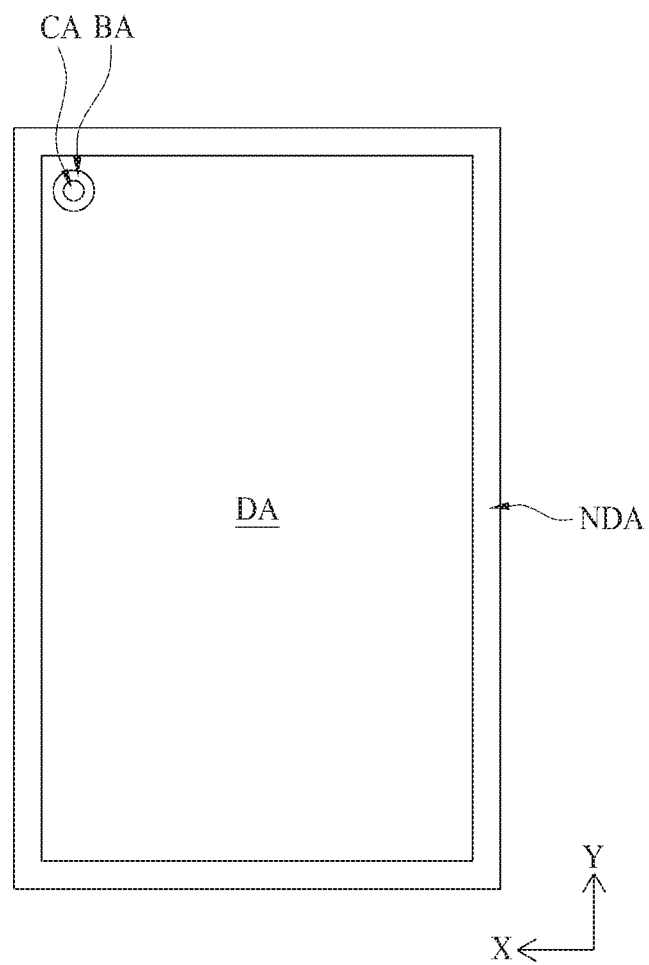
FIGS. 14 and 15 are rough plane views illustrating display devices according to various embodiments of the present disclosure.
Figure 15:
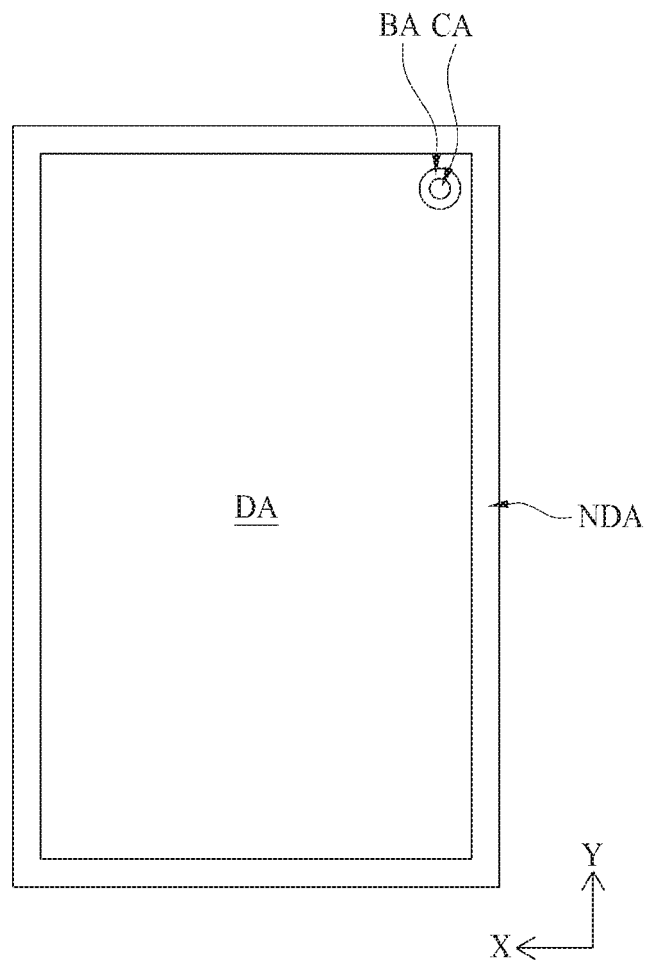

FIGS. 14 and 15 are rough plane views illustrating display devices according to various embodiments of the present disclosure. A position of a camera area (CA) and a buffer area (BA) on the plane shown in FIGS. 11 to 13 is different from that of FIG. 1.

In case of FIG. 14, the camera area (CA) and the buffer area (BA) are positioned between the center of the display area (DA) and the left end of the display area (DA) with respect to the X-axis of the display area (DA) on the plane, and more particularly, are positioned to be close to the left end of the display area (DA). In this respect, the position of the camera area (CA) and the buffer area (BA) shown in FIG. 14 is different from that of FIG. 1.

In case of FIG. 15, the camera area (CA) and the buffer area (BA) are positioned between the center of the display area (DA) and the right end of the display area (DA) with respect to the X-axis of the display area (DA) on the plane, and more particularly, are positioned to be close to the right end of the display area (DA). In this respect, the position of the camera area (CA) and the buffer area (BA) shown in FIG. 15 is different from that of FIG. 1.

In addition to the above cases of FIGS. 14 and 15, the position of the camera area (CA) and the buffer area (BA) can be changed in various methods while being surrounded by the display area (DA).

Meanwhile, according as the camera area (CA) and the buffer area (BA) surrounding the camera area (CA) are prepared inside the display area (DA), the buffer area (BA) and the camera area (CA) are surrounded by the display area (DA), but are not limited to this structure. For example, the camera area (CA) and the buffer area (BA) surrounding the camera area (CA) can be prepared inside the non-display area (NDA), whereby the buffer area (BA) and the camera area (CA) can be surrounded by the non-display area (NDA).

Even though the buffer area (BA) and the camera area (CA) are surrounded by the non-display area (NDA), the structure in each of the buffer area (BA) and the camera area (CA) can be the same as that of the aforementioned embodiments.

In addition to the effects of the present disclosure as mentioned above, additional advantages and features of the present disclosure will be clearly understood by those skilled in the art from the above description of the present disclosure. It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

What is claimed is:

1. A display device comprising:
    an organic light emitting device in a display area on a substrate
    a thin film transistor being connected with the organic light emitting device;
    a protecting portion surrounding at least a portion of a camera area on the substrate;
    a dam structure disposed between the thin film transistor and the protecting portion;
    an encapsulation layer including a first encapsulation layer, a second encapsulation layer on the first encapsulation layer, and a third encapsulation layer on the second encapsulation layer; and
    a hole in the camera area, the hole provided inside the display area,
    wherein the first encapsulation layer and the third encapsulation layer are disposed on a side surface and an upper surface of the dam structure.

2. The display device according to claim 1,
    wherein the protecting portion includes a first layer, a second layer on the first layer, and a third layer on the second layer, and
    wherein the first layer and the third layer are formed of a material with an oxidation degree lower than the second layer.

3. The display device according to claim 1, wherein the protecting portion comprises a conductive material.

4. The display device according to claim 3,
    wherein the thin film transistor includes a gate electrode, a source electrode and a drain electrode, and
    wherein the protecting portion is formed of a same material as the source electrode or the drain electrode.

5. The display device according to claim 1,
    wherein the protecting portion includes a plurality of portions, and
    wherein the protecting portion is provided in a buffer area surrounding the camera area.

6. The display device according to claim 1,
    wherein a first lateral surface of the protecting portion confronting the camera area is formed in a groove structure toward a direction being farther away from the camera area.

7. The display device according to claim 6,
    wherein a width between the first lateral surface of the protecting portion and a second lateral surface of the protecting portion corresponding to an opposite lateral surface to the first lateral surface is gradually decreased as it goes from its upper portion to its central portion, and is then gradually increased as it goes from its central portion to its lower portion.

8. The display device according to claim 6,
    wherein a second lateral surface of the protecting portion corresponding to an opposite lateral surface to the first lateral surface is formed in a groove structure toward a direction being closer to the camera area.

9. The display device according to claim 2,
    wherein a thickness in the second layer is larger than a thickness in each of the first layer and the third layer.

10. The display device according to claim 5,
    wherein the buffer area includes an inorganic insulating layer on the substrate, an organic insulating layer on the inorganic insulating layer, an electrode on the organic insulating layer, and the encapsulation layer on the electrode.

11. The display device according to claim 10,
    wherein the electrode and the encapsulation layer are provided on the protecting portion.

12. The display device according to claim 10,
    wherein the protecting portion is not overlapped with the organic insulating layer.

13. The display device according to claim 10,
    wherein the buffer area further includes the dam structure provided on the organic insulating layer.

14. The display device according to claim 1,
    wherein a lower surface of the third encapsulation layer is brought into contact with an upper surface of the first encapsulation layer in an overlap area between the encapsulation layer and the dam structure.

15. The display device according to claim 1,
    wherein the dam structure includes a first dam structure, and a second dam structure on the first dam structure, and
    wherein the first dam structure is provided at a same height as that of a bank provided in the display area, and is formed of a same material as that of the bank.

16. The display device according to claim 1,
    wherein the hole is configured to penetrate through the substrate.

17. The display device according to claim 1,
    wherein the camera area is formed in a circular shape, an oval shape, or a polygonal shape in plan view.

18. The display device according to claim 1, wherein the dam structure is not overlapped with the protection portion.

19. A display device comprising:
an organic light emitting device in a display area on a substrate;
a thin film transistor being connected with the organic light emitting device;
a protecting portion surrounding at least a portion of a camera area on the substrate, the protecting portion formed of a same material as a material of the source electrode or the drain electrode;
a hole in the camera area, the hole provided inside the display area; and
an encapsulation layer including a first encapsulation layer, a second encapsulation layer on the first encapsulation layer, and a third encapsulation layer on the second encapsulation layer,
wherein a first lateral surface of the protecting portion confronting the camera area is formed in a groove structure, and
wherein at least one of the first encapsulation layer and the third encapsulation layer is discontinuous on the groove structure.

20. The display device according to claim 19, wherein the groove structure is furrowed toward a direction being farther way from the camera area.

* * * * *